US008853791B2

(12) United States Patent
Schroeder et al.

(10) Patent No.: US 8,853,791 B2
(45) Date of Patent: Oct. 7, 2014

(54) SRAM MEMORY CELL HAVING A DOGLEG SHAPED GATE ELECTRODE STRUCTURE

(75) Inventors: Uwe Paul Schroeder, Lake Carmel, NY (US); Martin Ostermayr, Bavaria (DE)

(73) Assignee: Infineon Technologies AG, Neubiberg (DE)

( * ) Notice: Subject to any disclaimer, the term of this patent is extended or adjusted under 35 U.S.C. 154(b) by 637 days.

(21) Appl. No.: 11/593,290

(22) Filed: Nov. 6, 2006

(65) Prior Publication Data

US 2008/0122008 A1    May 29, 2008

(51) Int. Cl.
*H01L 27/07*    (2006.01)
*G11C 11/412*   (2006.01)
*H01L 27/11*    (2006.01)

(52) U.S. Cl.
CPC .......... *H01L 27/1104* (2013.01); *G11C 11/412* (2013.01)
USPC ................. 257/390; 365/182; 257/E27.098; 257/E21.662

(58) Field of Classification Search
CPC ........................... H01L 2924/1434–2924/1437
USPC ............ 365/72, 182, 390; 257/390, E27.098, 257/E21.661, E21.662
See application file for complete search history.

(56) References Cited

U.S. PATENT DOCUMENTS

| | | | |
|---|---|---|---|
| 2005/0141265 A1* | 6/2005 | Yokoyama | 365/154 |
| 2007/0080423 A1* | 4/2007 | Tsuboi et al. | 257/506 |
| 2008/0031029 A1* | 2/2008 | Liaw | 365/63 |

* cited by examiner

*Primary Examiner* — Daniel Whalen
*Assistant Examiner* — Suberr Chi
(74) *Attorney, Agent, or Firm* — Slater & Matsil, L.L.P.

(57) ABSTRACT

A memory cell includes diffusion regions formed in a substrate. Each of the diffusion regions extends along a vertical direction in a layout view at a substrate level. A first gate electrode structure at a gate electrode level is generally dogleg shaped. The first gate electrode structure extends in an oblique direction, turns to a horizontal direction, extends over and crosses the diffusion regions in the horizontal direction. A first contact structure at a contact level is generally rectangular shaped in the layout view of the cell. The first contact structure electrically connects a first source/drain region of the first diffusion region to the first gate electrode structure and the first source/drain region of the second diffusion region. The first contact structure extends from the first source/drain region of the first diffusion region to the first source/drain region of the second diffusion region at the contact level.

29 Claims, 4 Drawing Sheets

SRAM MEMORY CELL HAVING A DOGLEG SHAPED GATE ELECTRODE STRUCTURE

TECHNICAL FIELD

The present invention relates to a memory cell, and in particular a six-transistor SRAM cell for use in integrated circuits and semiconductor devices. More particularly, embodiments of the invention relate to an improved layout for a six-transistor SRAM cell.

BACKGROUND

Static random access memory (SRAM) is a type of semiconductor memory. The word "static" indicates that the memory retains its contents as long as power remains applied, unlike dynamic RAM (DRAM) that needs to be periodically refreshed with its memory content. However, SRAM should not be confused with read-only memory or flash memory. SRAM is volatile memory, preserving data only while power is continuously applied.

There are different types of SRAM cells. One common form of SRAM cell is a six-transistor (6T) SRAM cell. A 6T SRAM cell includes two cross-coupled inverters, where the gates of the transistors of each of the inverters is coupled to the commonly-coupled drains of the transistors of the other inverter. Each of these commonly-coupled drain nodes are coupled to a bitline via a pass transistor.

SUMMARY OF THE INVENTION

In accordance with one aspect of the present invention, which will be summarized in this paragraph, a memory cell is provided. The memory includes a first diffusion region, a second diffusion region, a third diffusion region, a fourth diffusion region, a first gate electrode structure, and a first contact structure. The first, second, third, and fourth diffusion regions are formed in a substrate. Each of the diffusion regions extends along a vertical direction in a layout view of the cell. The diffusion regions are at a substrate level. The diffusion regions are separated from each other by isolation regions at the substrate level. The first gate electrode structure is at a gate electrode level. The gate electrode level is over the substrate level. The first gate electrode structure is generally dogleg shaped. The first gate electrode structure extends from a first source/drain region of the second diffusion region toward the third diffusion region in an oblique direction, turns to a horizontal direction, extends over and crosses the third diffusion region in the horizontal direction, and extends over and crosses the fourth diffusion region in the horizontal direction. The horizontal direction is substantially orthogonal to the vertical direction. The oblique direction is at an oblique angle relative to the horizontal direction. The first contact structure is at least partially located at a contact level. The contact level is above the gate electrode level and the substrate level. The first contact structure is generally rectangular shaped at the contact level in the layout view of the cell. The first contact structure electrically connects a first source/drain region of the first diffusion region to the first gate electrode structure and the first source/drain region of the second diffusion region. The first contact structure extends from the first source/drain region of the first diffusion region to the first source/drain region of the second diffusion region at the contact level.

The foregoing has outlined rather broadly features of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The following is a brief description of the drawings, which illustrate exemplary embodiments of the present invention and in which.

DETAILED DESCRIPTION OF ILLUSTRATIVE EMBODIMENTS

Figure 1:
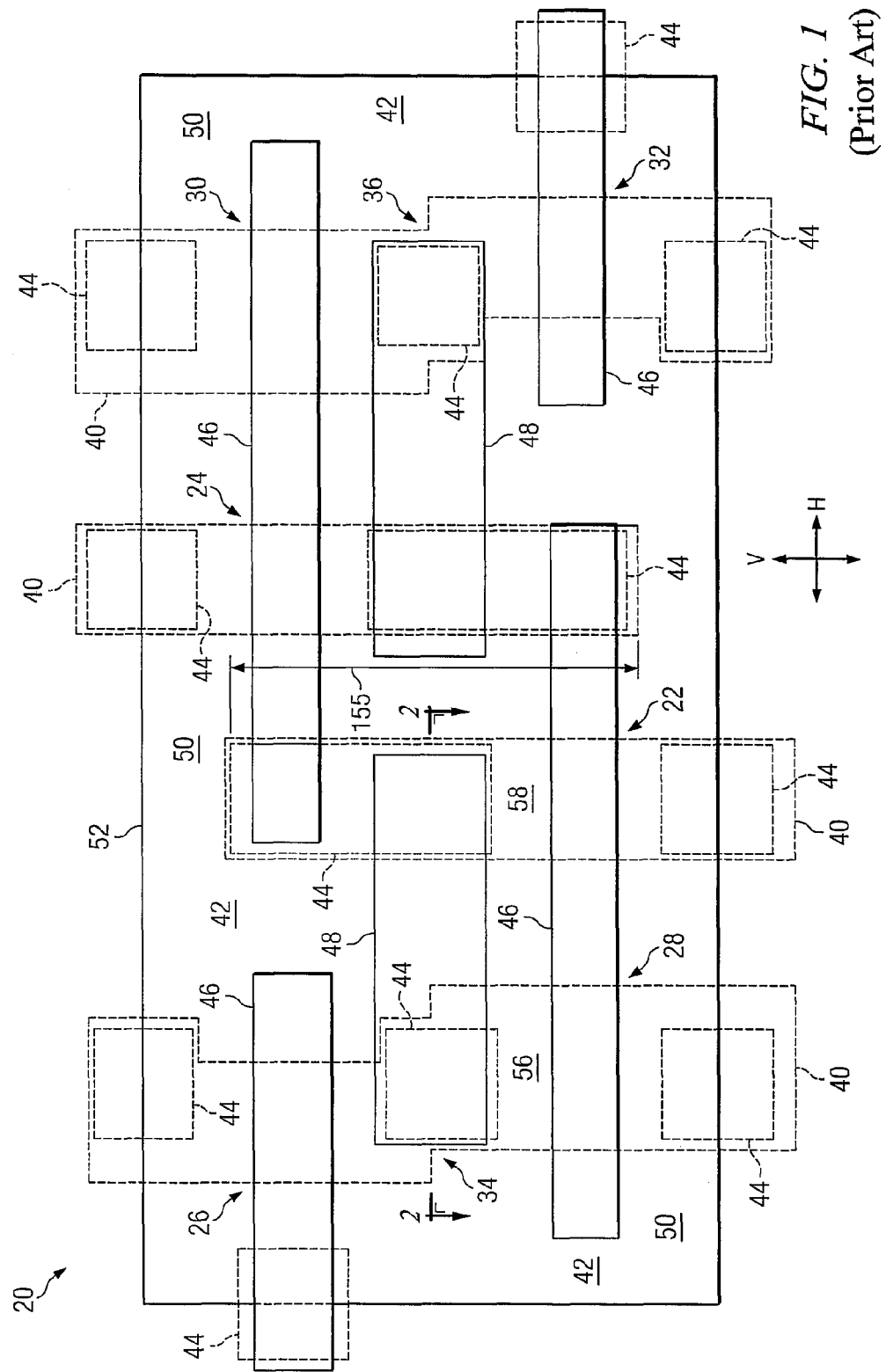
FIG. 1 is a plan view of a conventional 6T SRAM cell structure.

Referring now to the drawings, wherein like reference numbers are used herein to designate like or similar elements throughout the various views, illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

FIG. 1 is a plan view, also referred to in the art as an overhead, layout, or top view, of a conventional 6T SRAM cell 20. For illustrative purposes, the layout of the conventional 6T SRAM cell 20 is shown with reference to a vertical axis V and a horizontal axis H. The plan view in FIG. 1 shows diffusion regions 40 in a substrate 42 underlying contact structures 44, gate electrode structures 46, and metal structures (also referred to as metal wires) 48. Shallow trench isolations (STI) structures 50 are formed in the substrate 42 between the diffusion regions 40. The conventional 6T SRAM cell boundary 50 is also shown for illustrative purposes.

Figure 2:
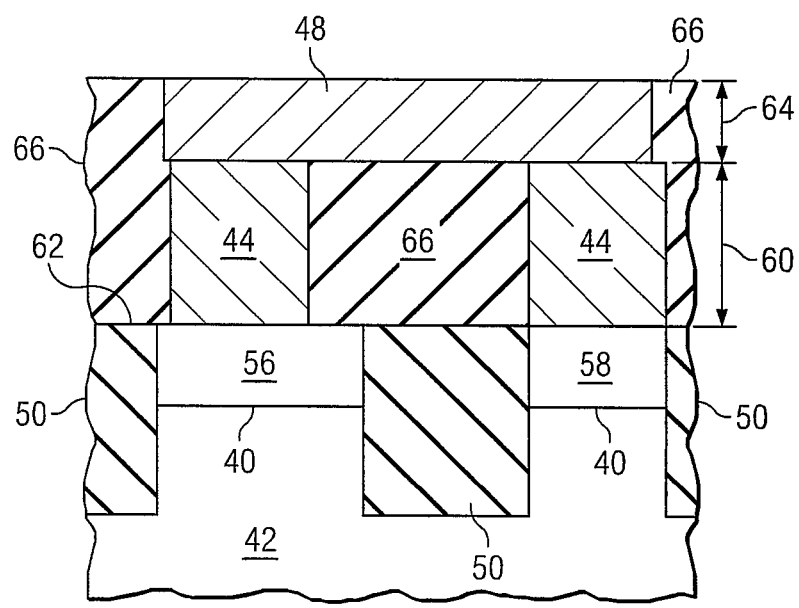
FIG. 2 is a cross-sectional view showing a portion of the conventional 6T SRAM cell, as taken along line 2-2 in FIG. 1.

FIG. 2 is a cross-sectional view of the conventional 6T SRAM cell 20, as taken along line 2-2 in FIG. 1. The cross-section in FIG. 2 includes the storage node 34 (see FIG. 1). The portion of the storage node 34 shown in FIG. 2 shows the shared source/drain region 56 (see FIG. 1) and the source/drain region 58 (see FIG. 1) electrically connected by the contact structures 44 (see FIG. 1) and the metal wire 48 (see FIG. 1) formed thereon. The contacts 44 are in a contact level 60 that is located between the substrate surface 62 and the first metal level 64. Any silicidation of the source/drain regions, any silicidation of the gate structures, and any barrier/seed layers that may be present in an actual device are not shown in the figures for purposes of simplifying the figures. The first metal level 64 is located above the contact level 60 and includes the metal wire 48. The contacts 44 and the metal wire 48 are surrounded by a dielectric material 66, which may be any suitable dielectric material (e.g., low-k dielectric material). The first metal layer 64 may also be referred to as Metal 1, M1, the Metal 1 layer, the Metal 1 level, or the first layer of metallization, for example.

Generally, an embodiment of the present invention provides an improved six-transistor (6T) static random access memory (SRAM) cell structure for use in an SRAM chip, to be incorporated into any other chip (e.g., system-on-chip structures), or for any other suitable application. An SRAM chip includes multiple SRAM arrays. Each SRAM array may include thousands, millions, or billions of 6T SRAM cells. In at least one of the SRAM arrays, each 6T SRAM cell in the array may be an SRAM cell having a structure in accordance with an embodiment of the present invention.

Figure 3:
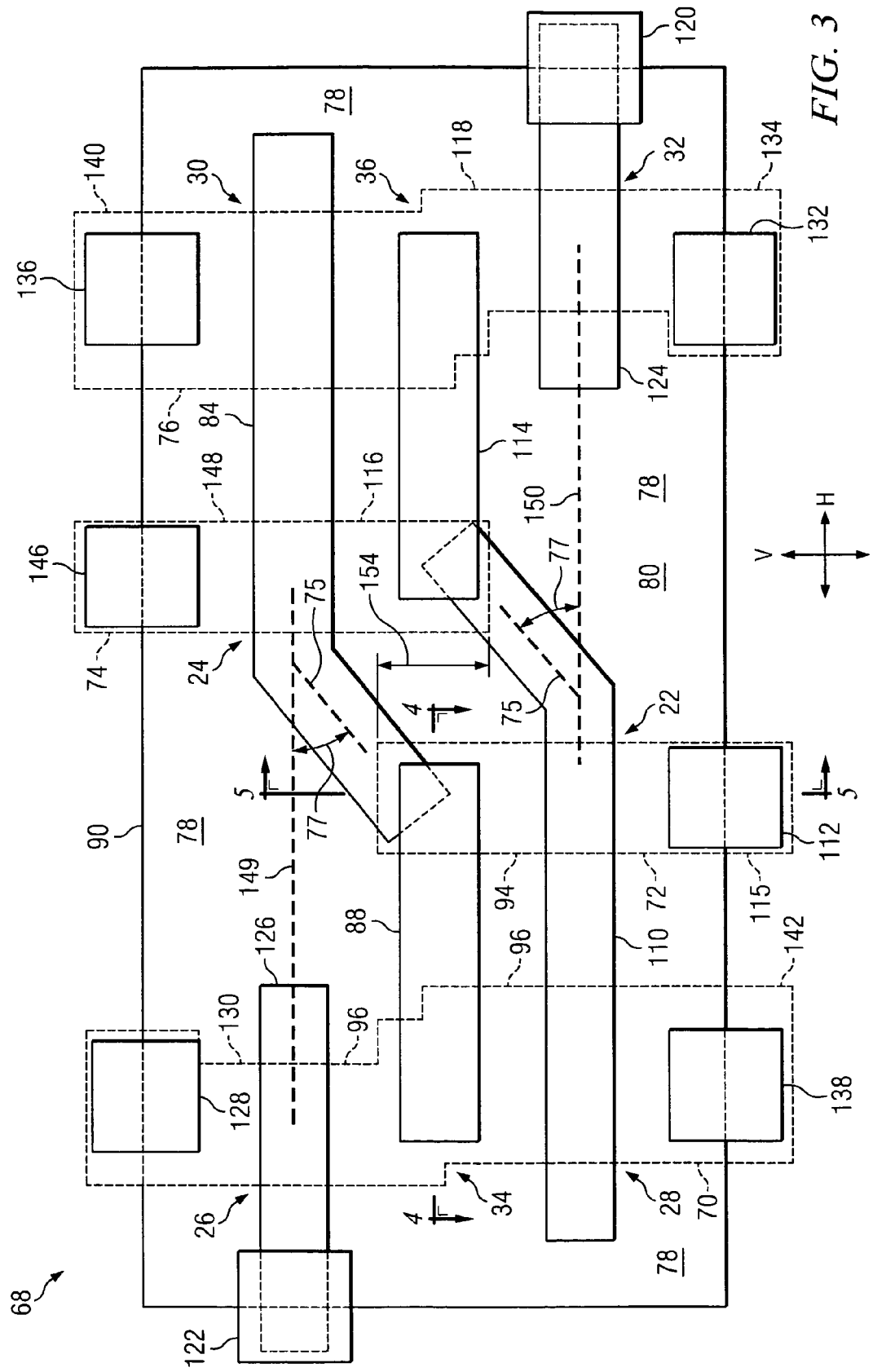
FIG. 3 is a plan view of a 6T SRAM cell structure of an illustrative embodiment of the present invention.
Figure 4:
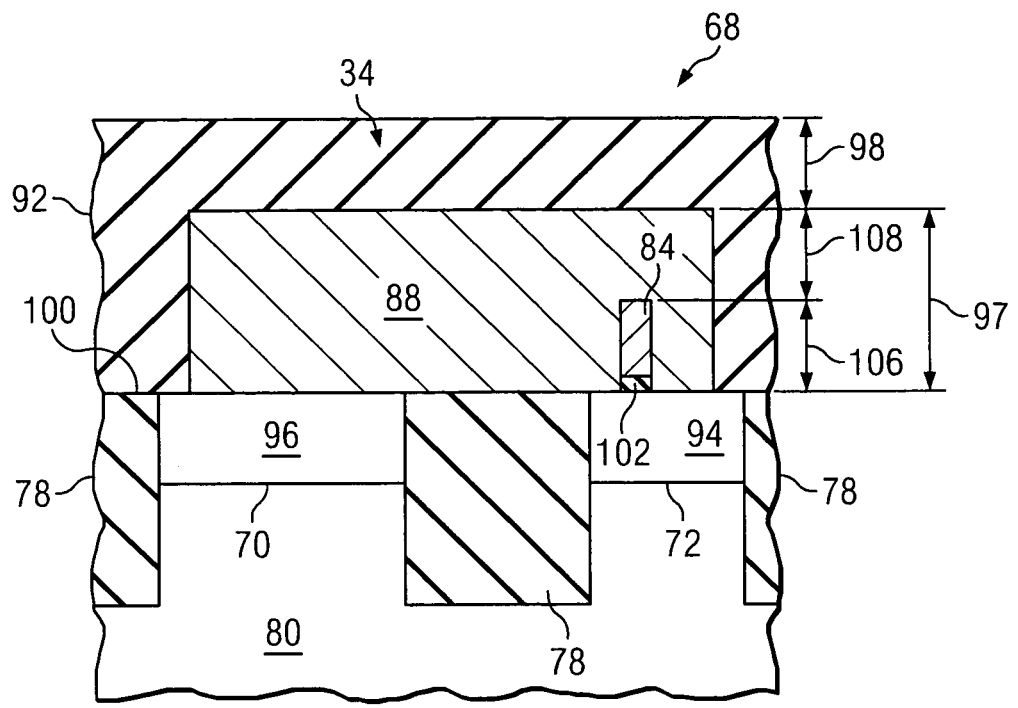
FIG. 4 is a cross-sectional view showing a portion of the 6T SRAM cell, as taken along line 4-4 in FIG. 3.
Figure 5:
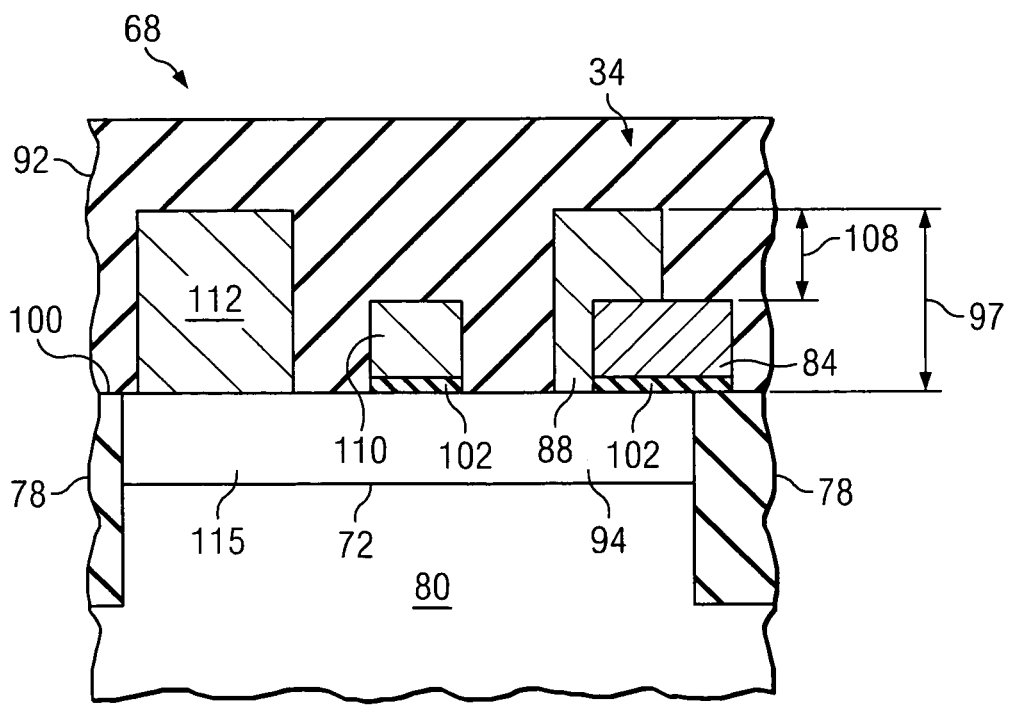
FIG. 5 is a cross-sectional view showing a portion of the 6T SRAM cell, as taken along line 5-5 in FIG. 3.

FIGS. 3-5 show various views of a 6T SRAM cell 68 in accordance with a first illustrative embodiment of the present invention. The 6T SRAM cell 68 of the first embodiment will have the same electrical connections shown in FIG. 1, but with a different structure layout. The cell boundary 90 of 6T SRAM cell 68 is shown in FIG. 3, but merely for illustrative purposes. For providing reference directions, the vertical direction V in the layout view of FIG. 3 is shown substantially orthogonal to the horizontal direction H. As shown in FIG. 3, the 6T SRAM cell 68 of the first embodiment includes vertically extended diffusion regions 70, 72, 74, 76 separated by isolation regions 78 in a substrate 80.

A gate electrode structure 84 in FIG. 3 has a generally dogleg shape. More specifically, the gate electrode structure 84 extends from a source/drain region 94 of the diffusion region 72 toward the diffusion region 74 in an oblique direction 75. The oblique direction 75 is at an oblique angle 77 relative to the horizontal direction H. In a preferred embodiment, the oblique angle 77 is about 45 degrees. Then, the gate electrode structure 84 turns to the horizontal direction H, and extends over and crosses the diffusion region 74 in the horizontal direction H. In a preferred embodiment, the gate electrode structure 84 turns toward the horizontal direction H prior to or at the edge of the diffusion region 74 so that the gate electrode structure 84 crosses the diffusion region 74 at a substantially orthogonal angle. In other embodiments (not shown), the turn toward the horizontal direction H may occur over or past the diffusion region 74 so that the gate electrode structure 84 partially or completely crosses the diffusion region 74 at the oblique direction 75. Then, the gate electrode structure 84 extends over and crosses the diffusion region 76 in the horizontal direction H (preferably orthogonal to the vertically extending diffusion region 76).

As shown in FIG. 3, a portion of the gate electrode structure 84 is formed directly under, and is electrically connected to the rectangular contact 88 at the storage node 34. The rectangular contact 88 has a generally rectangular shape when in the layout view (see FIG. 3). The rectangular contact 88 may also be referred to as a stretched contact, an oversized contact, or a contact minibar, for example. The storage node 34 in the 6T SRAM cell 68 of the first embodiment is further illustrated in FIG. 4.

FIG. 4 is a cross-sectional view of the storage node 34 of the 6T SRAM cell 68 as taken along the line 4-4 in FIG. 3. A dielectric 92 is formed over the substrate 80. The rectangular contact structure 88 is formed directly on the source/drain region 94 in the diffusion region 72. The rectangular contact structure 88 extends to, and is formed directly on the shared source/drain region 96 in the diffusion region 70. The shared diffusion region 96 is shared by the two NMOS transistors 26 and 28. The contact structure 88 is formed directly on a portion of the gate electrode structure 84. The contact 88 is in a contact level 97 between the first metallization level 98 and the substrate surface 100. The gate electrode structure 84 includes a gate dielectric layer 102, which electrically isolates the gate electrode structure 84 from the diffusion region 72. The gate electrode structure 84 is in a gate electrode level 106 extending from the substrate surface 100. It is noted that a portion 108 of the rectangular contact structure 88 overlies the gate electrode structure 84.

FIG. 5 also shows a portion of the storage node 34 in a cross-sectional view of the 6T SRAM cell 68, as taken along the line 5-5 in FIG. 3. In FIG. 5, the rectangular contact structure 88 is overlying, touching, and electrically connected to the source/drain diffusion region 72 and a portion of the gate electrode structure 84. Again, FIG. 5 shows that a portion 108 of the rectangular contact structure 88 overlies the gate electrode structure 84, and the rectangular contact 88 is also formed directly on the source/drain region 94 of the diffusion region 72.

FIG. 5 also shows the gate electrode structure 110 formed directly on and crossing the diffusion region 72. The contact structure 112 is formed directly on the source/drain region 115 of the diffusion region 72. In embodiments, the contact structure 112 may be electrically connected to a power supply source (e.g., VDD, DVDD, 1.1 V, 0.9 V, 0.5 V) by vias and metal wires (not shown in FIG. 5 for simplification), for example.

Referring again to the layout view of the 6T SRAM cell 68 shown in FIG. 3, the gate electrode structure 110 has the same dogleg shape of the gate electrode structure 84 but is oriented differently relative to the vertical V and horizontal H directions (rotated 180 degrees). As is common practice in SRAM layout, it is preferred (although not necessary) that the SRAM has two mirror symmetric sides so that the SRAM looks the same when rotated 180 degrees. More specifically, the gate electrode structure 110 extends over and crosses the diffusion region 70 (preferably orthogonal to the diffusion region 70) to the diffusion region 72 in the horizontal direction H. After crossing over the diffusion region 72 (preferably orthogonal to the diffusion region 72) in the horizontal direction H, the gate electrode structure 110 turns toward the oblique direction 75 (e.g., 45 degrees relative to the horizontal direction H) and extends toward and to the source/drain region 116 of the diffusion region 74 in the oblique direction 75.

As shown in FIG. 3, a portion of the gate electrode structure 110 is formed directly under, and is electrically connected to the rectangular contact structure 114 at the storage node 36. The second contact structure 114 is generally rectangular shaped and is at least partially in the contact level 97. Note that the contact level 97 may overlap with the gate electrode level 106 in some places (see FIGS. 4 and 5). The rectangular contact structure 114 is formed directly on the source/drain region 116 in the diffusion region 74. The rectangular contact structure 114 extends to, and is formed directly on the shared source/drain region 118 in the diffusion region 76. The shared source/drain region 118 is shared by the two NMOS transistors 30 and 32. The rectangular contact structure 114 is also formed directly on a portion of the gate electrode structure 110. Thus, the rectangular contact structure 114 electrically connects the shared source/drain region 118, the source/drain region 116, and the gate electrode structure 110 to form the storage node 36.

The contact structures 120 and 122 are formed directly over and are electrically connected to the gate electrode structures 124 and 126, respectively. The contact structures 120 and 122 are located at the contact level 97 and may be electrically connected to each other by vias or metal wires, for example. The contact structures 120 and 122 may further be electrically connected to a word line wire (not shown).

The contact structure 128 is located at the contact level 97 and is electrically connected to the source/drain region 130 of the diffusion region 70. The contact structure 128 may be electrically connected to a BLB bit line by vias or metal wires (not shown), for example. Similarly, the contact structure 132 is at least partially located at the contact level 97 and is electrically connected to the source/drain region 134 of the diffusion region 76. The contact structure 132 may be electrically connected to a BL bit line by vias or metal wires (not shown), for example.

Still referring to FIG. 3, the contact structures 136 and 138 are at least partially located at the contact level 97, and are electrically connected to the source/drain region 140 of the diffusion region 76, and to the source/drain region 142 of the diffusion region 70, respectively. In an embodiment, the contact structures 136 and 138 may be electrically connected to each other and/or to a ground source (e.g., VSS, DVSS, AVSS, 0 volts) by vias or metal wires (not shown), for example.

The contact structure 146 is at least partially located at the contact level 97 and is electrically connected to the source/drain region 148 of the diffusion region 74. In an embodiment, the contact structure 146 may be electrically connected to the contact structure 112 and to a power supply source (e.g., VDD, DVDD, 1.1 V, 0.9 V, 0.5 V) by vias and metal wires (not shown), for example.

It is shown in the 6T SRAM cell 68 of FIG. 3, that the gate electrode structure 126 is aligned with a portion of the gate electrode structure 84 extending along the horizontal direction, and along the same horizontal axis 149. Similarly, the gate electrode structure 124 is shown aligned with a portion of the gate electrode structure 110 extending along the horizontal direction, and along the same horizontal axis 150. This is a preferred layout for an embodiment of the present invention.

Although not shown, one skilled in the art will recognize that the word line, bit lines, power supply line, and ground line may be metal wires at any metal level, including Metal 1, Metal 2, Metal 3, or the top level metal, for example. Embodiments of the present invention include the 6T SRAM cell 68 electrically connected to the word line, bit lines, power supply line, and ground line using any structure, including but not limited to vias between any layer or level (e.g., VIA1, VIA2, VIA3), and metal wires.

As shown in FIG. 3, an embodiment of the present invention advantageously provides a 6T SRAM cell 68 without Metal 1 level wires making connections at the storage nodes 34 and 36. Instead, the rectangular contact structures 88 and 114 provide the connections at the storage nodes 34 and 36 at the contact level. A Metal 1 wire electrically connected to a storage node may be sufficiently exposed to other noisy metal wires (e.g., Metal 1, Metal 2, or Metal 3 wires) such that the Metal 1 wire causes the storage node to be susceptible to the undesired electrical effects imposed on the Metal 1 wire. Undesired electrical effects may include parasitic capacitance, parasitic resistance, undesired node coupling, and noise injection, for example. However, embodiments of the present invention do not include Metal 1 wires electrically connected to storage nodes and thus do not expose the storage nodes to undesired electrical effects. Thus, the enhanced electrical protection of the storage nodes in embodiments of the present invention results in enhanced performance of the 6T SRAM cell.

Embodiments of the present invention further advantageously provide a smaller 6T SRAM cell that is sized below currently achievable 6T SRAM cell sizes. The smaller 6T SRAM cells in embodiments may be used as a unit cell, and reproduced thousands, millions, or billions of times in an SRAM array or in an SRAM integrated circuit, for example. Thus, the smaller dimensions provided by embodiments of the present invention will improve chip area savings in proportion to the thousands, millions, or billions of times in which it is reproduced.

Another advantage of an embodiment of the present invention is providing a decrease in pattern density on the Metal 1 level and at the contact level. A decrease in pattern density on the Metal 1 and contact levels results in a decrease in the minimum feature sizes of wires at the Metal 1 level. The decreased pattern density decreases minimum feature sizes at Metal 1 will contribute to the decrease in the wafer defect density, and improve yield.

Yet another advantage of an embodiment is a decreased common run length 154 of diffusion (see FIG. 3). Compare the common run length 155 in FIG. 1 with the common run length 154 in FIG. 3. The decreased common run length 154 between diffusion regions 72 and 74 (see FIG. 3) results in an improved STI 78 fill in the 6T SRAM cell structures of an embodiment. Enhanced electrical isolation of diffusion regions is thus provided, thereby enhancing the performance of the 6T SRAM cells and reducing the likelihood of defects or shorts at the STI 78.

Another advantage of an embodiment is the parallel orientation of the long axis of the rectangular contact structures 88 and 114 relative to the gate electrodes 84 and 110. In FIG. 1, the local interconnect contacts are drawn out orthogonally to the direction of the gate electrodes. As a result, optical proximity corrections counteracting print foreshortening can be carried out easier in the present invention, because the risk of shorting to the adjacent gate electrodes is smaller.

Although embodiments of the present invention and at least some of its advantages have been described in detail, it should be understood that various changes, substitutions, and alterations can be made herein without departing from the spirit and scope of the invention as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A memory cell comprising:
   a first diffusion region, a second diffusion region, a third diffusion region, and a fourth diffusion region formed in a substrate,
   wherein each of the diffusion regions extends along a vertical direction in a layout view of the cell, and
   wherein the diffusion regions are at a substrate level, and
   wherein the diffusion regions are separated from each other by isolation regions at the substrate level;
   a first gate electrode structure disposed within a gate electrode level, the first gate electrode structure comprising a gate electrode overlying a gate dielectric layer, the gate electrode level being over the substrate level and having a height defined by a cross-sectional thickness of the gate electrode and the gate dielectric layer, wherein the first gate electrode structure extends from a first source/drain region of the second diffusion region toward the third diffusion region in an oblique direction, turns to a horizontal direction, extends over and crosses the third diffusion region in the horizontal direction, and extends over and crosses the fourth diffusion region in the horizontal direction, wherein the first gate electrode structure turns to the horizontal direction before overlapping with the third diffusion region, wherein the horizontal direction is substantially orthogonal to the vertical direction, and wherein the oblique direction is at an oblique angle relative to the horizontal direction and having a positive slope with respect to the horizontal direction; and a first contact structure being at least partially located at a contact level, the contact level being above the gate electrode level and the substrate level.

2. The memory cell of claim 1, wherein the first source/drain region of the first diffusion region is a shared source/drain region for two transistors.

3. The memory cell of claim 1, wherein the oblique angle is about 45 degrees.

4. The memory cell of claim 1, further comprising:
a second gate electrode structure, a third gate electrode structure, and a fourth gate electrode structure, wherein the gate electrode structures are at the gate electrode level,
   wherein the second gate electrode structure is generally dogleg shaped,
   wherein the second gate electrode structure extends over and crosses the first diffusion region in the horizontal direction, extends over and crosses the second diffusion region in the horizontal direction, turns to the oblique direction, and extends to a first source/drain region of the third diffusion region in the oblique direction,
   wherein the third gate electrode structure extends over and crosses the first diffusion region in the horizontal direction in the layout view of the cell, and
   wherein the fourth gate electrode structure extends over and crosses the fourth diffusion region in the horizontal direction.

5. The memory cell of claim 4, wherein the third gate electrode structure is aligned with a portion of the first gate electrode structure extending along the horizontal direction, along a same axis in the horizontal direction.

6. The memory cell of claim 4, wherein the fourth gate electrode structure is aligned with a portion of the second gate electrode structure extending along the horizontal direction, along a same axis in the horizontal direction.

7. The memory cell of claim 4, further comprising:
a second contact structure being at least partially located at the contact level,
   wherein the second contact structure is generally rectangular shaped at the contact level in the layout view of the cell,
   wherein the second contact structure electrically connects a first source/drain region of the fourth diffusion region to the second gate electrode structure and the first source/drain region of the third diffusion region,
   wherein the second contact structure extends from the first source/drain region of the fourth diffusion region to the first source/drain region of the third diffusion region at the contact level.

8. The memory cell of claim 7, wherein the first source/drain region of the fourth diffusion region is a shared source/drain region for two transistors.

9. The memory cell of claim 7, further comprising:
a third contact structure being at least partially located at the contact level, wherein the third contact structure electrically connects the third gate electrode structure to a word line;
a fourth contact structure being at least partially located at the contact level, wherein the fourth contact structure electrically connects a second source/drain region of the first diffusion region to a first bit line;
a fifth contact structure being at least partially located at the contact level, wherein the fifth contact structure electrically connects a third source/drain region of the first diffusion region to a first ground line;
a sixth contact structure and a seventh contact structure, both being at least partially located at the contact level,
   wherein the sixth contact structure electrically connects a second source/drain region of the second diffusion region to the seventh contact structure via a metal line located in a metallization level, the metallization level being above the contact level, and
   wherein the seventh contact structure electrically connects a second source/drain region of the third diffusion region to the sixth contact structure via a metal line;
an eighth contact structure being at least partially located at the contact level, wherein the eighth contact structure electrically connects a second source/drain region of the fourth diffusion region to a second ground line;
a ninth contact structure being at least partially located at the contact level, wherein the ninth contact structure electrically connects a third source/drain region of the fourth diffusion region to a second bit line; and
a tenth contact structure being at least partially located at the contact level, wherein the tenth contact structure electrically connects the fourth gate electrode structure to the word line.

10. A memory device comprising a plurality of six transistor SRAM cells arranged in an array of rows and columns, each six transistor SRAM cell comprising the memory cell of claim 1.

11. An integrated circuit chip comprising the plurality of six-transistor SRAM cells of claim 10, wherein the array of rows and columns is embedded in a logic device so as to form an embedded SRAM array.

12. The memory cell of claim 1,
wherein the first contact structure is generally rectangular shaped at the contact level in the layout view of the cell,
wherein the first contact structure electrically connects a first source/drain region of the first diffusion region to the first gate electrode structure and the first source/drain region of the second diffusion region, and
wherein the first contact structure extends from the first source/drain region of the first diffusion region to the first source/drain region of the second diffusion region at the contact level.

13. The memory cell of claim 1, wherein the first gate electrode structure is generally dogleg shaped.

14. A six-transistor SRAM cell comprising:
a first diffusion region, a second diffusion region, a third diffusion region, and a fourth diffusion region formed in a substrate,
   wherein each of the diffusion regions extends along a vertical direction in a layout view of the cell,
   wherein the diffusion regions are at a substrate level, and wherein the diffusion regions are separated from each other by isolation regions at the substrate level; and a first gate electrode structure, a second gate electrode structure, a third gate electrode structure, and a fourth gate electrode structure, wherein the gate electrode structures are located within a gate electrode level, the gate electrode structures comprising gate electrodes overlying gate dielectric layers, the gate electrode level being over the substrate level and having a height defined by a cross-sectional thickness of the gate electrodes and the gate dielectric layers, wherein the first gate electrode structure is generally dogleg shaped, wherein the first gate electrode structure extends from a first source/drain region of the second diffusion region toward the third diffusion region in an oblique direction, turns to a horizontal direction, extends over and crosses the third diffusion region in the horizontal direction, and extends over and crosses the fourth diffusion region in the horizontal direction, wherein the horizontal direction is substantially orthogonal to the vertical direction, and wherein the oblique direction is at an oblique angle of about 45 degrees relative to the horizontal direction and wherein the oblique direction has a positive slope with respect to the horizontal direction.

15. The six-transistor SRAM cell of claim 14, wherein the first source/drain region of the first diffusion region is a shared source/drain region for two transistors.

16. The six-transistor SRAM cell of claim 14, wherein the third gate electrode structure is aligned with a portion of the first gate electrode structure extending along the horizontal direction, along a first axis in the horizontal direction.

17. The six-transistor SRAM cell of claim 16, wherein the fourth gate electrode structure is aligned with a portion of the second gate electrode structure extending along the horizontal direction, along a second axis in the horizontal direction.

18. The six-transistor SRAM cell of claim 14, wherein the first source/drain region of the fourth diffusion region is a shared source/drain region for two transistors.

19. The six-transistor SRAM cell of claim 14, wherein the second gate electrode structure is generally dogleg shaped, wherein the second gate electrode structure extends over and crosses the first diffusion region in the horizontal direction, extends over and crosses the second diffusion region in the horizontal direction, turns to the oblique direction, and extends to a first source/drain region of the third diffusion region in the oblique direction, wherein the third gate electrode structure extends over and crosses the first diffusion region in the horizontal direction in the layout view of the cell, and wherein the fourth gate electrode structure extends over and crosses the fourth diffusion region in the horizontal direction.

20. The six-transistor SRAM cell of claim 19, further comprising:

a first contact structure being at least partially located at a contact level, the contact level being above the gate electrode level and the substrate level, wherein the first contact structure is generally rectangular shaped at the contact level in the layout view of the cell, wherein the first contact structure electrically connects a first source/drain region of the first diffusion region to the first gate electrode structure and the first source/drain region of the second diffusion region, and wherein the first contact structure extends from the first source/drain region of the first diffusion region to the first source/drain region of the second diffusion region at the contact level; and a second contact structure being at least partially located at the contact level, wherein the second contact structure is generally rectangular shaped at the contact level in the layout view of the cell, wherein the second contact structure electrically connects a first source/drain region of the fourth diffusion region to the second gate electrode structure and the first source/drain region of the third diffusion region, and wherein the second contact structure extends from the first source/drain region of the fourth diffusion region to the first source/drain region of the third diffusion region at the contact level.

21. The six-transistor SRAM cell of claim 20, further comprising:

a third contact structure being at least partially located at the contact level, wherein the third contact structure electrically connects the third gate electrode structure to a word line;

a fourth contact structure being at least partially located at the contact level, wherein the fourth contact structure electrically connects a second source/drain region of the first diffusion region to a first bit line;

a fifth contact structure being at least partially located at the contact level, wherein the fifth contact structure electrically connects a third source/drain region of the first diffusion region to a first ground line;

a sixth contact structure and a seventh contact structure, both being at least partially located at the contact level, wherein the sixth contact structure electrically connects a second source/drain region of the second diffusion region to the seventh contact structure via a metal line located in a metallization level, the metallization level being above the contact level, and wherein the seventh contact structure electrically connects a second source/drain region of the third diffusion region to the sixth contact structure via the metal line;

an eighth contact structure being at least partially located at the contact level, wherein the eighth contact structure electrically connects a second source/drain region of the fourth diffusion region to a second ground line;

a ninth contact structure being at least partially located at the contact level, wherein the ninth contact structure electrically connects a third source/drain region of the fourth diffusion region to a second bit line; and a tenth contact structure being at least partially located at the contact level, wherein the tenth contact structure electrically connects the fourth gate electrode structure to the word line.

22. A six-transistor SRAM cell comprising:

a first diffusion region, a second diffusion region, a third diffusion region, and a fourth diffusion region formed in a substrate, wherein each of the diffusion regions extends along a vertical direction in a layout view of the cell, wherein the diffusion regions are at a substrate level, and wherein the diffusion regions are separated from each other by isolation regions at the substrate level;

a first gate electrode structure, a second gate electrode structure, a third gate electrode structure, and a fourth gate electrode structure, wherein the gate electrode structures are disposed within a gate electrode level, the gate electrode structures comprising gate electrodes overlying gate dielectric layers, the gate electrode level being over the substrate level and having a height defined by a cross-sectional thickness of the gate electrodes and the gate dielectric layers, wherein the first gate electrode structure extends from a first source/drain region of the second diffusion region toward the third diffusion region in an oblique direction with a positive slope relative to a horizontal direction, turns to the horizontal direction, extends over and crosses the third diffusion region in the horizontal direction, and extends over and crosses the fourth diffusion region in the horizontal direction, wherein the first gate electrode structure turns to the horizontal direction before overlapping with the third diffusion region, wherein the horizontal direction is substantially orthogonal to the vertical direction, wherein the second gate electrode structure extends over and crosses the first diffusion region in the horizontal direction, extends over and crosses the second diffusion region in the horizontal direction, turns to the oblique direction, and extends to a first source/drain region of the third diffusion region in the oblique direction, wherein the third gate electrode structure extends over and crosses the first diffusion region in the horizontal direction in the layout view of the cell, and wherein the fourth gate electrode structure extends over and crosses the fourth diffusion region in the horizontal direction; and ten contact structures, each having part of its structure at a contact level, the contact level being above the gate electrode level and the substrate level.

23. The six-transistor SRAM cell of claim 22, wherein the first source/drain region of the first diffusion region is a shared source/drain region for two transistors.

24. The six-transistor SRAM cell of claim 22, wherein the first source/drain region of the fourth diffusion region is a shared source/drain region for two transistors.

25. The six-transistor SRAM cell of claim 22, wherein the first gate electrode structure is generally dogleg shaped, wherein the oblique direction is at an oblique angle of about 45 degrees relative to the horizontal direction, wherein the second gate electrode structure is generally dogleg shaped, wherein the third gate electrode structure is aligned with a portion of the first gate electrode structure extending along the horizontal direction, along a first axis in the horizontal direction, and wherein the fourth gate electrode structure is aligned with a portion of the second gate electrode structure extending along the horizontal direction, along a second axis in the horizontal direction.

26. The six-transistor SRAM cell of claim 22,
wherein a first contact structure of the ten contact structures is generally rectangular shaped at the contact level in the layout view of the cell, wherein the first contact structure electrically connects a first source/drain region of the first diffusion region to the first gate electrode structure and the first source/drain region of the second diffusion region, wherein the first contact structure extends from the first source/drain region of the first diffusion region to the first source/drain region of the second diffusion region at the contact level,
wherein a second contact structure of the ten contact structures is generally rectangular shaped at the contact level in the layout view of the cell, wherein the second contact structure electrically connects a first source/drain region of the fourth diffusion region to the second gate electrode structure and the first source/drain region of the third diffusion region, wherein the second contact structure extends from the first source/drain region of the fourth diffusion region to the first source/drain region of the third diffusion region at the contact level,
wherein a third contact structure of the ten contact structures electrically connects the third gate electrode structure to a word line,
wherein a fourth contact structure of the ten contact structures electrically connects a second source/drain region of the first diffusion region to a first bit line,
wherein a fifth contact structure of the ten contact structures electrically connects a third source/drain region of the first diffusion region to a first ground line,
wherein a sixth contact structure of the ten contact structures electrically connects a second source/drain region of the second diffusion region to a seventh contact structure of the ten contact structures via a metal line, the metal line being located in a metallization level, the metallization level being above the contact level,
wherein the seventh contact structure electrically connects a second source/drain region of the third diffusion region to the sixth contact structure via a metal line,
wherein an eighth contact structure of the ten contact structures electrically connects a second source/drain region of the fourth diffusion region to a second ground line,
wherein a ninth contact structure of the ten contact structures electrically connects a third source/drain region of the fourth diffusion region to a second bit line, and
wherein a tenth contact structure of the ten contact structures electrically connects the fourth gate electrode structure to the word line.

27. A memory cell comprising:
a first diffusion region, a second diffusion region, a third diffusion region, and a fourth diffusion region disposed in a substrate, wherein each of the diffusion regions extends along a vertical direction in a layout view of the memory cell; and
a first gate line disposed over and contacting a gate dielectric layer disposed over the substrate, the first gate line extending from a first source/drain region in the second diffusion region toward the third diffusion region in an oblique direction, the first gate line further extending over the third and the fourth diffusion regions in a horizontal direction, wherein the horizontal direction is substantially orthogonal to the vertical direction, and wherein the oblique direction is at an oblique angle relative to the horizontal direction and has a positive slope relative to the horizontal direction.

28. The memory cell of claim 27, further comprising:
a first contact structure being at least partially located at a contact level, the contact level being above a gate electrode level and a substrate level,
wherein the first contact structure is generally rectangular shaped at the contact level in the layout view of the cell,
wherein the first contact structure contacts a first source/drain region of the first diffusion region to a first gate electrode structure and the first source/drain region of the second diffusion region, and
wherein the first contact structure extends from the first source/drain region of the first diffusion region to the first source/drain region of the second diffusion region at the contact level.

29. The memory cell of claim 27, wherein the diffusion regions are separated from each other by isolation regions at a substrate level.

* * * * *